United States Patent
Li et al.

(10) Patent No.: US 10,229,985 B1
(45) Date of Patent: Mar. 12, 2019

(54) VERTICAL FIELD-EFFECT TRANSISTOR WITH UNIFORM BOTTOM SPACER

(71) Applicant: International Business Machines Corporation, Armonk, NY (US)

(72) Inventors: Juntao Li, Cohoes, NY (US); Kangguo Cheng, Schenectady, NY (US); Peng Xu, Santa Clara, CA (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/830,665

(22) Filed: Dec. 4, 2017

(51) Int. Cl.
- *H01L 29/66* (2006.01)
- *H01L 29/06* (2006.01)
- *H01L 21/3105* (2006.01)
- *H01L 21/311* (2006.01)
- *H01L 29/78* (2006.01)

(52) U.S. Cl.
CPC .. *H01L 29/66553* (2013.01); *H01L 21/31053* (2013.01); *H01L 21/31111* (2013.01); *H01L 21/31116* (2013.01); *H01L 29/0653* (2013.01); *H01L 29/6653* (2013.01); *H01L 29/6656* (2013.01); *H01L 29/66666* (2013.01); *H01L 29/7827* (2013.01)

(58) Field of Classification Search
CPC ......... H01L 29/66068; H01L 29/66666; H01L 29/66795; H01L 29/7827; H01L 29/785; H01L 29/7851; H01L 29/7855; H01L 29/7831; H01L 29/6653; H01L 29/66553; H01L 29/6656; H01L 21/31; H01L 21/31053; H01L 21/31055; H01L 21/31056; H01L 21/31105; H01L 21/31111; H01L 21/31144; H01L 21/32; H01L 21/823431; H01L 29/823821
See application file for complete search history.

(56) References Cited

U.S. PATENT DOCUMENTS

| | | | |
|---|---|---|---|
| 6,660,590 B2 | 12/2003 | Yoo | |
| 6,846,709 B1 | 1/2005 | Lojek | |
| 7,015,092 B2 | 3/2006 | Jaiprakash et al. | |
| 7,033,877 B2 | 4/2006 | Chaudhry et al. | |
| 9,245,885 B1 | 1/2016 | Xie et al. | |
| 9,530,700 B1 | 12/2016 | Mallela et al. | |
| 9,627,511 B1 | 4/2017 | Cheng et al. | |
| 9,647,112 B1 | 5/2017 | Balakrishnan et al. | |
| 9,741,716 B1 | 8/2017 | Cheng et al. | |
| 9,755,073 B1 | 9/2017 | Cheng et al. | |

*Primary Examiner* — Scott B Geyer
(74) *Attorney, Agent, or Firm* — Vazken Alexanian; Ryan, Mason & Lewis, LLP

(57) ABSTRACT

A method of forming a semiconductor structure includes patterning two or more fins over a top surface of a bottom source/drain layer, the bottom source/drain layer disposed over a substrate. The method also includes forming bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions, and liner regions disposed adjacent the dielectric regions. The two or more fins comprise channels for a vertical field-effect transistor (VFET) device.

20 Claims, 7 Drawing Sheets

100

200

300

400

500

600

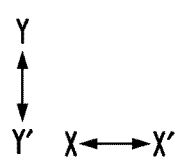
FIG. 7
700
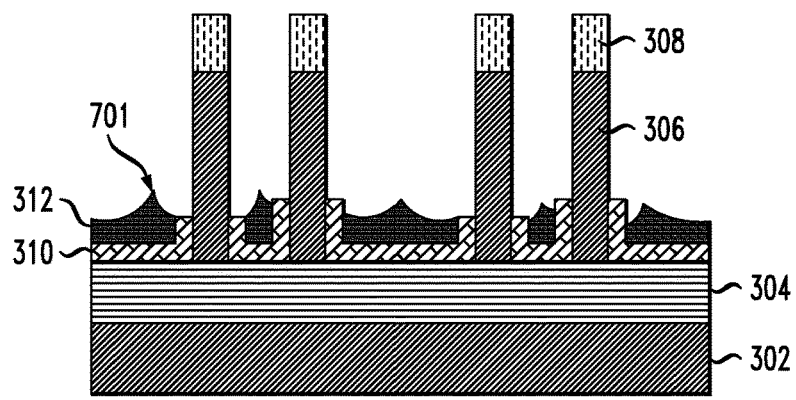
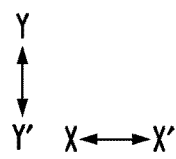
FIG. 8
800
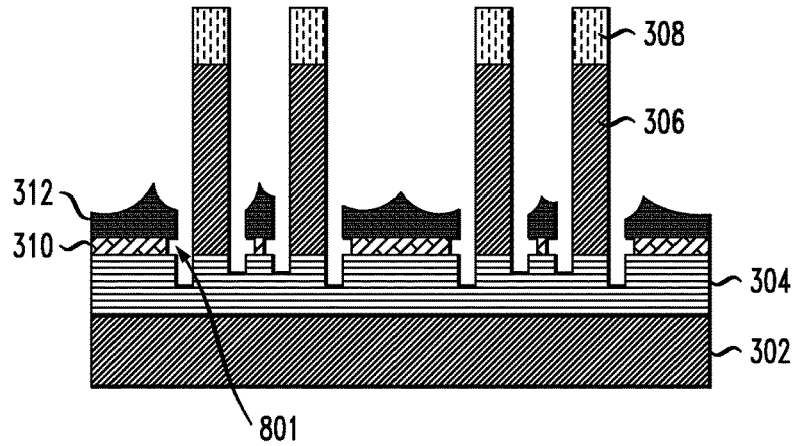

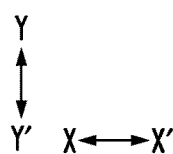
FIG. 9
900
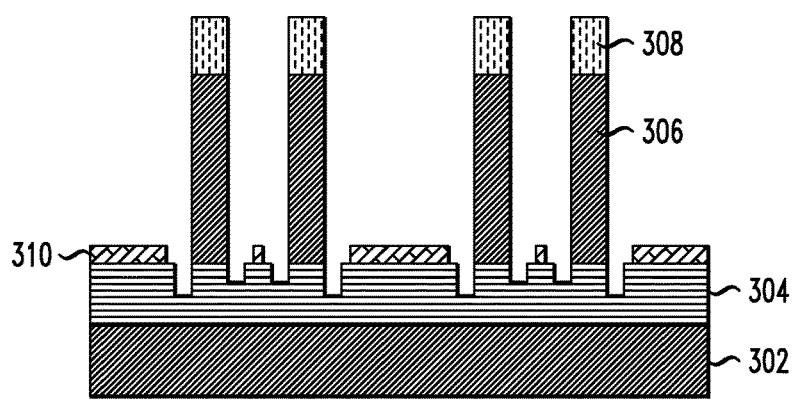
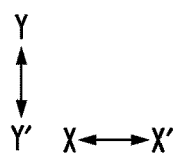
FIG. 10
1000
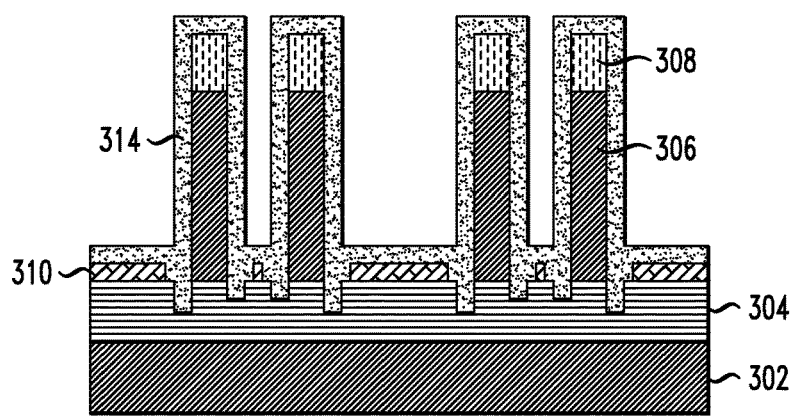

1100

1200

1300

US 10,229,985 B1

VERTICAL FIELD-EFFECT TRANSISTOR WITH UNIFORM BOTTOM SPACER

BACKGROUND

The present application relates to semiconductors, and more specifically, to techniques for forming semiconductor structures. Semiconductor structures include complementary metal-oxide-semiconductor (CMOS) structures. CMOS technology may be used for constructing integrated circuits, and finds uses in microprocessors, microcontrollers, static random-access memory (RAM) and other digital logic circuits. CMOS structures may use complementary and symmetrical pairs of p-type and n-type metal-oxide-semiconductor field effect transistors (MOSFETs) for logic functions.

As demands to reduce the size of transistor devices continue, new designs and fabrication techniques to achieve reduced device footprints are needed. Vertical-type transistors, such as vertical field-effect transistors (vertical FETs or VFETs) are an example of such a new design. When forming vertical FETs, spacers are provided between and around vertical structures.

SUMMARY

Embodiments of the invention provide techniques for forming VFETs with uniform bottom spacers.

For example, in one embodiment a method of forming a semiconductor structure comprises patterning two or more fins over a top surface of a bottom source/drain layer, the bottom source/drain layer disposed over a substrate. The method also comprises forming bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions, and liner regions disposed adjacent the dielectric regions. The two or more fins comprise channels for a VFET device.

In another embodiment, a semiconductor structure comprises a substrate, bottom source/drain regions disposed over the substrate, two or more fins disposed over a top surface of the bottom source/drain regions, and bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions and liner regions disposed adjacent the dielectric regions. The two or more fins comprise channels for a VFET device.

In another embodiment, an integrated circuit comprises a VFET device comprising a substrate, bottom source/drain regions disposed over the substrate, two or more fins disposed over a top surface of the bottom source/drain regions, the two or more fins comprising channels for the VFET device, and bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions and liner regions disposed adjacent the dielectric regions.

BRIEF DESCRIPTION OF THE DRAWINGS

FIG. 7 depicts a side cross-sectional view of the FIG. 6 structure following etch-back of the oxide, according to an embodiment of the invention.

FIG. 8 depicts a side cross-sectional view of the FIG. 7 structure following over etch of the liner into the source/drain region, according to an embodiment of the invention.

FIG. 9 depicts a side cross-sectional view of the FIG. 8 structure following removal of remaining portions of the oxide, according to an embodiment of the invention.

FIG. 10 depicts a side cross-sectional view of the FIG. 9 structure following spacer divot fill with a dielectric, according to an embodiment of the invention.

DETAILED DESCRIPTION

Illustrative embodiments of the invention may be described herein in the context of illustrative methods for forming VFETs with uniform bottom spacers, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

As described above, VFET technology has been explored as a viable device option for reducing the size of transistor devices, such as in continued CMOS scaling beyond 7 nanometer (nm) nodes. For VFET devices, bottom spacers are needed between and around the vertical structures (e.g., fins). Bottom spacer thickness uniformity, however, is difficult to control particularly as demands to reduce the size of devices continue. For example, vertical structures for VFETs may comprise vertical fins patterned using sidewall image transfer (SIT) processes. In SIT processes, fin pitch walking occurs. In addition, spacer etching has loading effects resulting from dense and isolated patterning regions.

Figure 1:
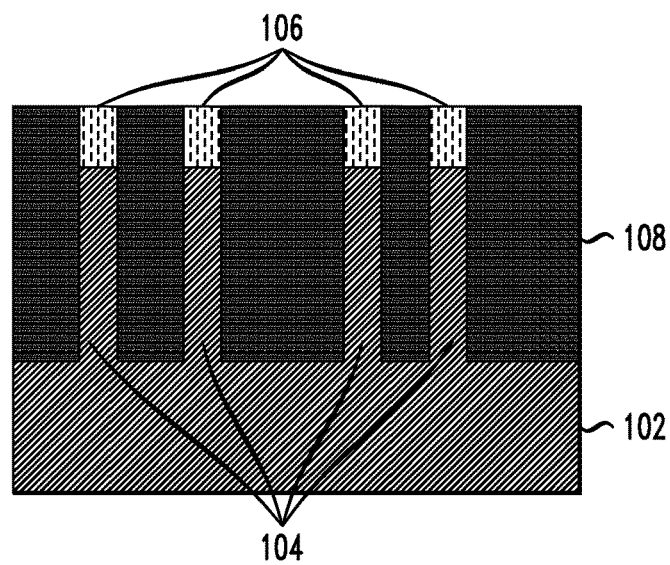
FIG. 1 depicts a side cross-sectional view of a semiconductor structure having fins formed over a substrate, according to an embodiment of the invention.

FIG. 1 shows a side cross-sectional view 100 of a semiconductor structure, comprising a plurality of fins 104 which are patterned on a substrate 102. Each of the fins 104 is topped with a hard mask 106. Oxide 108 is formed over the substrate 102 surrounding the vertical structures (each comprising one of the fins 104 topped by hard mask 106). The fins 104 may be patterned using SIT processing, which may result in fin pitch variation, such as fin pitch variation in the range of 30 nm to 40 nm. To form bottom spacers between the fins 104, the oxide 108 is etched.

Figure 2:
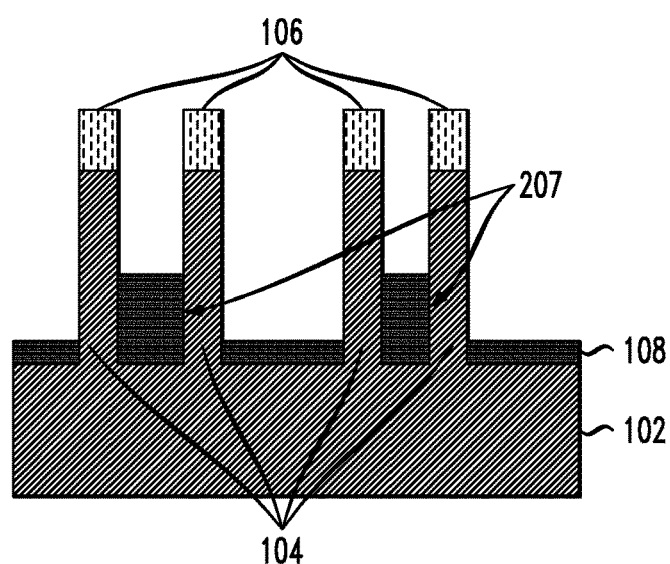
FIG. 2 depicts a side cross-section view of the FIG. 1 structure following formation of bottom spacers, according to an embodiment of the invention.

FIG. 2 shows a side cross-sectional view 200 of the FIG. 1 structure following etching of the oxide 108. As illustrated in FIG. 2, the etching results in non-uniform height in the remaining portions of the spacer 108. For example, the spacers 108 between some of the fins may have larger heights 207. This variation, as discussed above, may be a result of fin pitch walking, fin pitch variation, loading effects from dense and isolated patterning regions, etc. Variations in bottom spacer thickness are not desired, as it results in varying gate lengths. Embodiments provide techniques for forming uniform bottom spacers for VFET devices.

Figure 3:
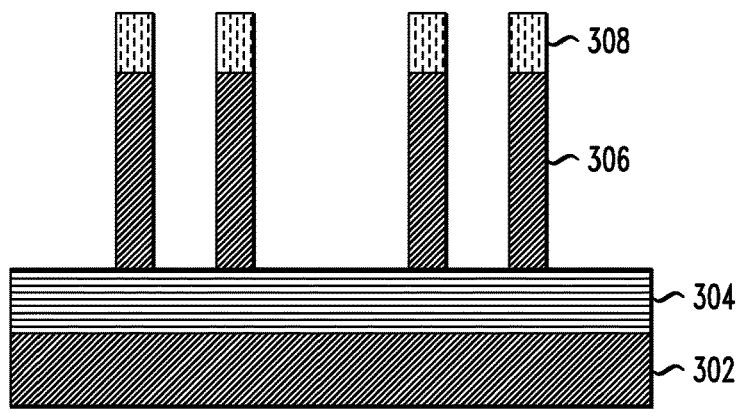
FIG. 3 depicts a side cross-sectional view of fins patterned over a source/drain region disposed over a substrate, according to an embodiment of the invention.

Illustrative processes for forming uniform bottom spacers in VFET devices will be described with respect to FIGS. 3-13. FIG. 3 depicts a side cross-sectional view 300 of a semiconductor structure. The semiconductor structure comprises a substrate 302, with a bottom source/drain layer or region 304 disposed over a top surface of the substrate 302. Fins 306 are patterned over a top surface of the bottom source/drain layer 304. Each fin 306 is topped with a hard mask 308.

The substrate 302 may comprise a semiconductor structure form of bulk silicon (Si), although other suitable materials may be used, such as various silicon-containing materials. Illustrative examples of silicon-containing materials suitable for the substrate 302 include, but are not limited to, Si, silicon germanium (SiGe), silicon germanium carbide (SiGeC), silicon carbide (SiC), polysilicon, epitaxial silicon, amorphous silicon, and multi-layers thereof. Although silicon is the predominantly used semiconductor material in wafer fabrication, alternative semiconductor materials can be employed, such as, but not limited to, germanium (Ge), gallium arsenide (GaAs), gallium nitride (GaN), cadmium telluride (CdTe) and zinc selenide (ZnSe). In an alternate embodiment, the substrate 302 may be silicon-on-insulator (SOI) wafer. As is known in the art, a SOI wafer includes a SOI layer separated from a substrate by a buried insulator. Suitable substrate materials include, but are not limited to, Si, strained Si, silicon carbide (SiC), Ge, SiGe, SiGeC, Si alloys, Ge alloys, GaAs, indium arsenide (InAs), indium phosphide (InP), or any combination thereof. Suitable dielectric materials for the buried insulator include, but are not limited to, an oxide material such as silicon dioxide ($SiO_2$). When the buried insulator is an oxide, the buried insulator may also be referred to as a buried oxide or BOX. The substrate 302 may have a width or horizontal thickness (in direction X-X') that varies, such as based on the number of vertical structures or fins 306 to be patterned.

The bottom source/drain layer 304 may comprise doped Si or doped silicon germanium (SiGe), although other suitable materials such as SiC, boron or phosphorus doped SiGe or Si, etc. The bottom source/drain layer 304 is usually doped. In a non-limiting illustrative example, the doping of the bottom source/drain layer 304 uses, for example, arsenic (As) or phosphorous (P) for n-type device (e.g., nFET), and boron (B) for a p-type device (e.g., pFET), at concentrations in the general range from $1 \times 10^{20}$ atoms/cm$^3$ to $2 \times 10^{21}$ atoms/cm$^3$. Doping of bottom source/drain layer 304 can be performed using, for example, ion implantation, or annealing if not using an epitaxial process. Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° Celsius (C) to 900° C., but is not necessarily limited thereto, and may be conducted at higher or lower temperatures as needed. A number of different sources may be used for the epitaxial growth. For example, the sources may include a precursor gas or gas mixture including for example, a silicon containing precursor gas (such as silane) and/or a germanium containing precursor gas (such as a germane). Carrier gases like hydrogen, nitrogen, helium and argon can also be used. The bottom source/drain layer 304 has a width or horizontal thickness (in direction X-X') matching that of the substrate 302 on which the bottom source drain/layer 304 is disposed. The bottom source/drain layer 304 has a height or vertical thickness (in direction Y-Y') ranging from 20 nm to 100 nm. It is to be appreciated, however, that other thicknesses that are lesser than or greater than this range may be employed as desired depending upon the particular.

The fins 306 may be patterned by initially depositing fin material over the top surface of the bottom source/drain layer 304, then patterning the fins 306 utilizing a SIT process. The fins 306 may comprise an undoped semiconductor layer for a channel region in a resulting structure. The undoped semiconductor layer, also referred to herein as a channel layer, can include, but is not necessarily limited to, Si, SiGe or other III-V materials. In accordance with an embodiment, the layers 304 and substrate 302 each comprise SiGe and Si. Each of the fins 306 may have a width or horizontal thickness (in direction X-X') ranging from 5 nm to 10 nm, although other thicknesses that are lesser than or greater than this range may be employed as desired depending upon the particular application. Each of the fins 308 may have a height or vertical thickness (in direction Y-Y') ranging from 20 nm to 50 nm, although other thicknesses that are lesser than or greater than this range may be employed as desired depending upon the particular application.

The hard masks 308 may comprise a nitride, an oxide-nitride bilayer, or another suitable material. In some embodiments the hard masks 308 may comprise an oxide such as silicon oxide (SiO), a nitride such as silicon nitride (SiN), an oxynitride such as silicon oxynitride (SiON), combinations thereof, etc. In some embodiments, the hard masks 308 are a silicon nitride such as $Si_3N_4$. The hard masks 308 may be formed by a thermal process, such as, for example, oxidation or nitridation of the top semiconductor layer (e.g., of the channel layer from which fins 306 are patterned). In other embodiments, combinations of other processes may be used to form the hard masks 308. The width or horizontal thickness (in direction X-X') of the hard masks 308 matches that of the underlying fins 306. Each of the hard masks 308 may have a height or vertical thickness (in direction Y-Y') ranging from 20 nm to 150 nm, although other thicknesses that are lesser than or greater than this range may be employed as desired depending upon the particular application.

Figure 4:
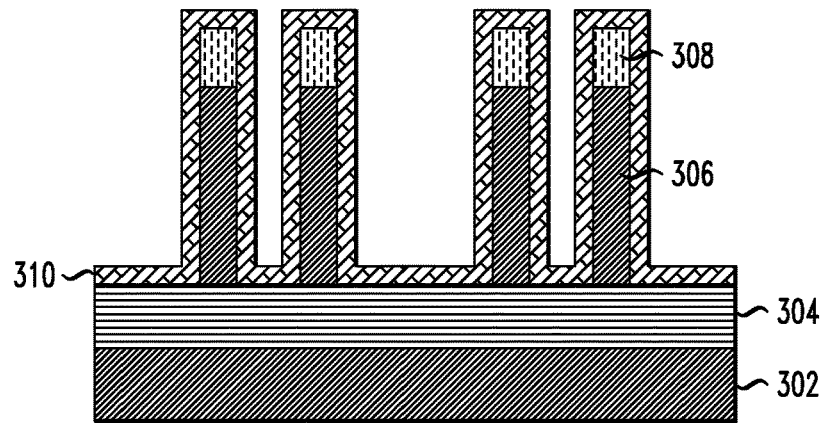
FIG. 4 depicts a side cross-sectional view of the FIG. 3 structure following deposition of a liner, according to an embodiment of the invention.

FIG. 4 shows a side cross-sectional view 400 of the FIG. 3 structure following deposition of a liner 310. The liner 310 may be formed using a conformal deposition process, such as atomic layer deposition (ALD) or plasma-enhanced chemical vapor deposition (PECVD), although other suitable conformal deposition processes may be used. The liner 310 may comprise SiN, silicon carbonitride (SiCN), or another suitable material such as silicon boron nitride (SiBN), a doped nitride, SiON, etc. In some embodiments, both the patterned hard masks 308 and the liner 310 are comprised of SiN. The liner 310 may have a uniform thickness ranging from 3 nm to 10 nm, although other thicknesses that are lesser than or greater than this range may be employed as desired depending upon the particular application.

Figure 5:
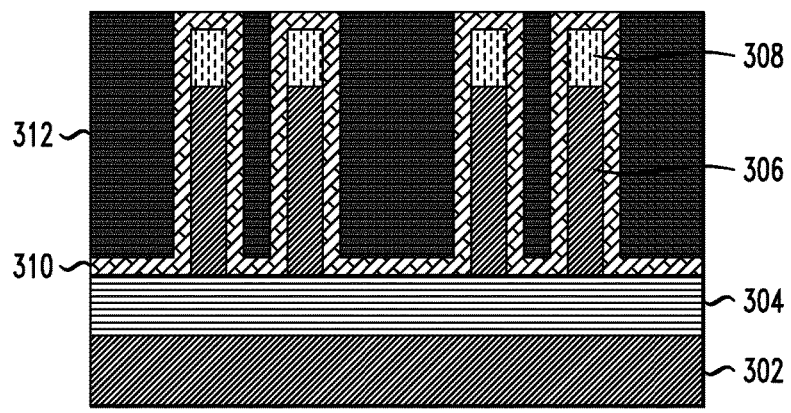
FIG. 5 depicts a side cross-sectional view of the FIG. 4 structure following deposition and planarization of an oxide, according to an embodiment of the invention.

FIG. 5 shows a side cross-sectional view 500 of the FIG. 4 structure following deposition and planarization of an oxide 312. The oxide 312 may initially be deposited over the liner 310 to fill regions between the fins 306 and over top surfaces of the liner 310 formed on top of the hard masks 308 over each of the fins 306. The oxide 312 may then be planarized, such as utilizing chemical mechanical planarization (CMP) to stop on top surfaces of the liner 310 formed over the hard masks 308 over each of the fins 306 as shown in FIG. 5.

Figure 6:
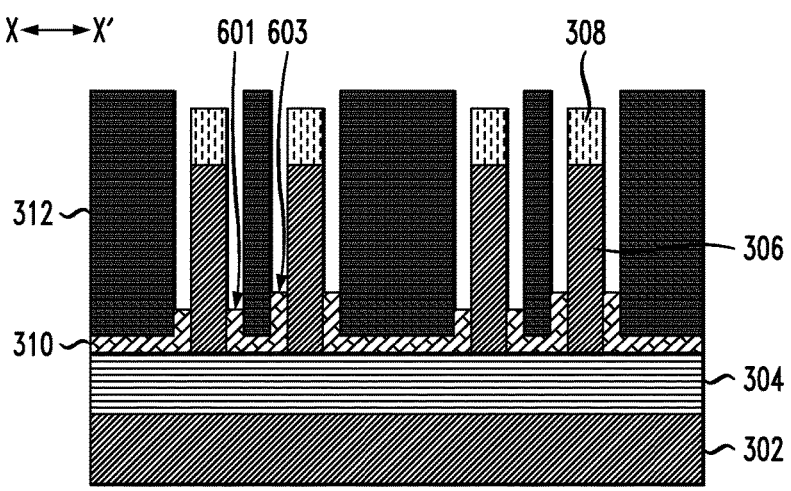
FIG. 6 depicts a side-cross-sectional view of the FIG. 5 structure following etch-back of the liner, according to an embodiment of the invention.

FIG. 6 shows a side cross-sectional view 600 of the FIG. 5 structure following etch-back of the liner 310. The liner 310 etch-back may utilize, for example, reactive-ion etching (RIE). Due to processing variability in the etch-back, the remaining portions of the liner 310 may have varying heights. This is illustrated by the varying heights 601 and 603 of the liner 310 formed on different sidewalls of one of the fins 306 shown in FIG. 6.

FIG. 7 shows a side cross-sectional view 700 of the FIG. 6 structure following etch-back of the oxide 312. The oxide 312 may be etched using an isotropic etch process. As illustrated, the etch-back may result in non-uniform thickness 701 of the remaining portions of the oxide 312. The remaining portions of the oxide 312 are sacrificial, which will be removed in down-stream processing described below.

FIG. 8 shows a side cross-sectional view 800 of the FIG. 7 structure following over etch of the liner 310 into the bottom source/drain layer 304. The over etch of the liner 310 in FIG. 8 may utilize an isotropic etch process such as a wet etch or a chemical downstream etch (CDE). For example, if the liner 310 includes SiN, a wet etch employing a combination of ethylene glycol and hydrofluoric acid can be employed to remove the liner 310. The duration of the isotropic etch can be timed such that partial dielectric nitride liner material 310 is removed under the sacrificial oxide layer 312 after the isotropic etch. Thus, as shown in FIG. 8, the etch process over etches into portions of the bottom source/drain layer 304, and forms lateral undercut regions 801 where portions of the liner 310 under the oxide 312 are removed.

FIG. 9 shows a side cross-sectional view 900 of the FIG. 8 structure following removal of remaining portions of the oxide 312. The remaining portions of the oxide 312 may be removed, for example, using a wet etch process.

FIG. 10 shows a side cross-sectional view 1000 of the FIG. 9 structure following divot fill of a dielectric 314 over the fins 306 and hard masks 308. The dielectric 314 may be a low-k dielectric. Low-k materials include, but are not limited to, amorphous carbon, fluorine-doped oxides, carbon-doped oxides, carbon-doped silicon oxide (SiCOH) or silicon boron carbide nitride (SiBCN), etc. Commercially-available low-k dielectric products and materials include Dow Corning's SiLK™ and porous SiLK™, Applied Materials' Black Diamond™, Texas Instrument's Coral™ and TSMC's Black Diamond™ and Coral™. The dielectric 314r may be deposited by plasma enhanced chemical vapor deposition (PECVD). As used herein, a low-k material has a dielectric constant less than that of SiN. The dielectric 314 is deposited to fill the regions of the bottom source/drain layer 304 that are removed during over etch of the liner 310 described above with respect to FIG. 8, as well to fill the lateral undercut regions of the liner 310 (e.g., 801) described above with respect to FIG. 8.

Figure 11:
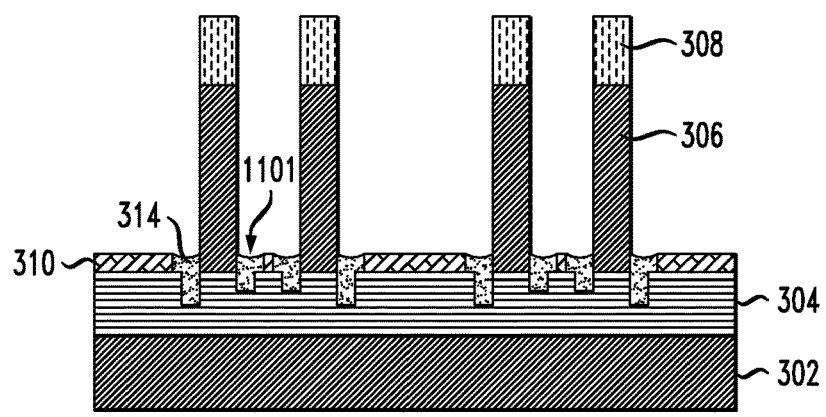
FIG. 11 depicts a side cross-sectional view of the FIG. 10 structure following etching of the divot fill dielectric, according to an embodiment of the invention.

FIG. 11 shows a side cross-sectional view 1100 of the FIG. 10 structure following etching of the dielectric 314. The dielectric 314 may be etched using an isotropic etch. The remaining portions of the dielectric 314 have a height (in direction Y-Y') that is uniform for each of the fins 306, such that resulting gate lengths are identical. As shown in FIG. 11, the remaining portions of the dielectric adjacent sidewalls of the fins 306 may have minor variations in height 1101, such as variations in the range of 0.5 nm to 2 nm. The terms "identical" and "uniform" as used herein include arrangement with such minor various in height.

The top surfaces of the remaining portions of the dielectric 314 also match that of the top surfaces of the remaining portions of the liner 310. The liner 310 and dielectric 314 form bottom spacers between the fins 306. As the planar liner 310 has uniform thickness, and the dielectric 314 formed on the sidewalls of each of the fins 306 is the same, uniform gate lengths are advantageously provided. Further advantages are provided by the bottom spacers being partially formed of the dielectric 314, which helps to reduce parasitic capacitance.

Figure 12:
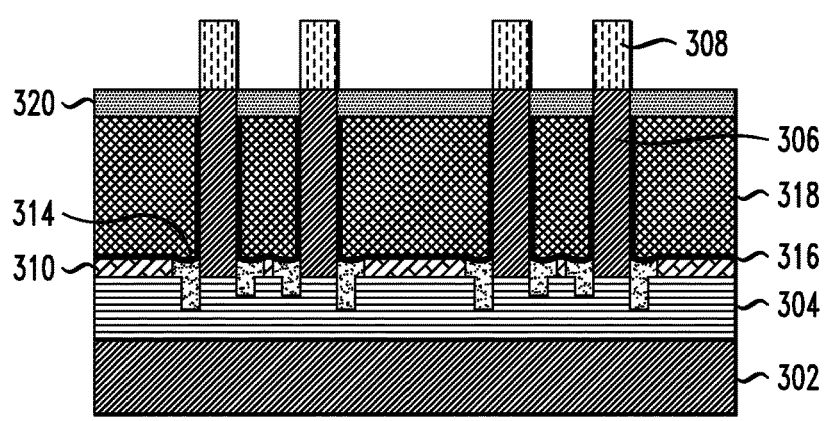
FIG. 12 depicts a side cross-sectional view of the FIG. 11 structure following formation of gates and top spacers, according to an embodiment of the invention.

FIG. 12 depicts a side cross-sectional view 1200 of the FIG. 11 structure following formation of an additional dielectric 316, gates 318 and top spacers 320. The dielectric 316, also referred to herein as a gate dielectric, may be formed from any appropriate insulating material. IN some embodiments, the dielectric 316 is a high-k dielectric material. A high-k dielectric material is a material having a dielectric constant k that is higher than that of $SiO_2$. Examples of high-k materials include but are not limited to metal oxides such as hafnium oxide ($HfO_2$), hafnium silicon oxide (HfSiO), lanthanum oxide ($La_2O_3$), lanthanum aluminum oxide ($LaAlO_3$), zirconium oxide ($ZrO_2$), zirconium silicon oxide (ZrSiO), zirconium silicon oxynitride (ZrSiON), tantalum oxide ($Ta_2O_5$), titanium oxide ($TiO_2$), barium strontium titanium oxide ($BaO_6SrTi_2$), barium titanium oxide ($BaO_3Ti$), strontium titanium oxide ($SrTiO_3$), yttrium oxide ($Y_2O_3$), aluminum oxide ($Al_2O_3$), lead scandium tantalum oxide (OPbScTa), and lead zinc niobate ($Pb(Zn_{1/3}Nb_{2/3})O_3$). The high-k dielectric may further include dopants such as lanthanum (La) and aluminum (Al).

In some embodiments, the dielectric 316 may be a combination of: (i) a high-k dielectric that is formed on top surfaces of the liner 310, dielectric 314 and portions of the sidewalls of the fins 306 (e.g., as shown in FIG. 11, the dielectric 316 has a height lower than a top surface of the fins 306); and (ii) a work function metal (WFM) formed over the high-k dielectric. The WFM metal formed over the high-k dielectric is also referred to as a gate work function setting layer between the gate dielectric and the gate conductor. The gate work function setting layer or WFM can be a metallic compound including but not limited to: (i) nitrides (e.g., titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), and niobium nitride (NbN)); (ii) carbides (e.g., titanium carbide (TiC), titanium aluminum carbide (TiAlC), tantalum carbide (TaC), and hafnium carbide (HfC)); and (iii) combinations thereof.

After deposition of the dielectric 316, gates 318 are formed. The gates 318 may be formed from any appropriate conductive material including, e.g., metals such as tungsten (W), nickel (Ni), titanium (Ti), molybdenum (Mo), tantalum (Ta), copper (Cu), platinum (Pt), silver (Ag), gold (Au), ruthenium (Ru), iridium (Ir), rhenium (Re), rhodium (Rh), and alloys thereof, polysilicon, or a conducting metallic compound material such as TaN, TiN, tungsten silicide (WSi$_2$), tungsten nitride (WN), ruthenium oxide (RuO$_2$), cobalt silicide (CoSi), or nickel silicide (NiSi). The conductive material may further include dopants that are incorporated during or after deposition. After deposition of the dielectric 316 and gates 318, CMP may be performed such that a top of the dielectric 316 and gates 318 have a height below the top surface of the fins 306 as illustrated.

Top spacers 320 are formed over the dielectric 316 and gates 318. The top spacers 320 may comprise a dielectric material such as SiO, SiN, SiON, a low-k material, or any suitable combination of these materials. Exemplary low-k materials suitable for use in the top spacers 320 include but are not limited to amorphous carbon, fluorine-doped oxides, carbon-doped oxides, SiCOH, SiBCN, etc. The top spacers 320 may be formed by directional deposition and etch back, such that top surfaces of the top spacers 320 have a height matching that of the top surfaces of the fins 306.

Figure 13:
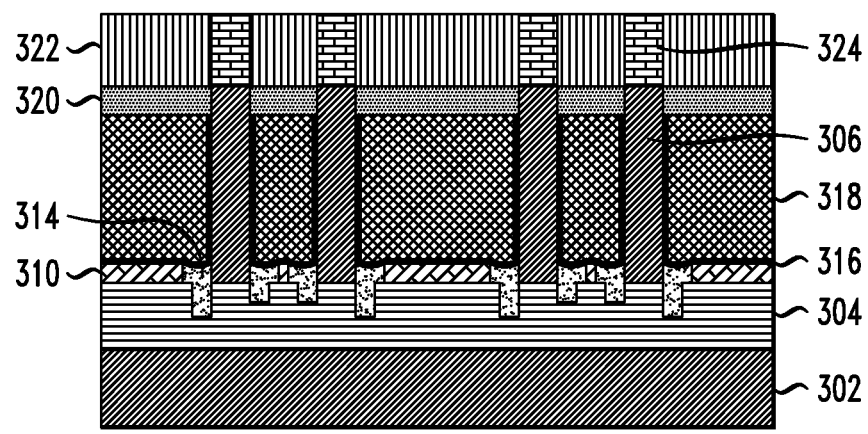
FIG. 13 depicts a side cross-sectional view of the FIG. 12 structure following deposition of an interlayer dielectric and formation of top source/drain epitaxial layers, according to an embodiment of the invention.

FIG. 13 shows a side cross-sectional view 1300 of the FIG. 12 structure following deposition of an interlayer dielectric (ILD) 322 and formation of top source/drain epitaxial layers 324. The ILD 322 is deposited over the top spacers 320, and may be formed of any suitable dielectric material including, for example, oxides, nitrides or oxynitrides. In some embodiments, the ILD layer 322 includes SiO$_2$. The ILD layer 322 may be formed, for example, by CVD or spin-coating. In some embodiments, the ILD layer 322 may be self-planarizing, or the top surface of the ILD 322 can be planarized by CMP. After deposition of the ILD 322, the hard masks 308 may be removed, such as using a selective etch process. Suitable selective etch processes include but are not limited to the use of fluorinated gas (e.g., SF$_6$, CH$_4$, or CHF$_3$) based dry etching or hot phosphoric acid (H$_3$PO$_4$) etching.

The top source/drain epitaxial layers 324 are formed over the top surfaces of the fins 306 in regions between the ILD 322 left exposed by removal of the hard masks 306. The top source/drain epitaxial layers 324 may comprise various suitable materials, which may depend on whether the source/drain epitaxial layers are nFET or pFET epitaxial layers. Application of sources for nFET and pFET epitaxial growth can be done by using block level patterning. For an nFET source/drain, As or P doped Si or SiC source/drain regions 324 are epitaxially grown. For a pFET, B doped SiGe or Si source/drain regions 324 are epitaxially grown. Doping can be at concentrations in the general range of e20/cm$^3$. As can be seen in FIG. 13, epitaxial growth is stopped prior to merging so that the epitaxial regions 324 are not merged with each other. Alternatively, the epitaxial growth is not stopped prior to merging so that the epitaxial regions 324 are merged with each other. While the shape of the epitaxial source/drain regions 324 is illustrated as a quadrilateral, the embodiments of the present invention are not necessarily limited thereto, and other epitaxial shapes, including, but not necessarily limited to, pentagonal, may be formed depending on orientations and materials used.

In some embodiments, a method of forming a semiconductor structure comprises patterning two or more fins over a top surface of a bottom source/drain layer, the bottom source/drain layer disposed over a substrate, and forming bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions and liner regions disposed adjacent the dielectric regions. The two or more fins comprise channels for a VFET device.

In some embodiments, the dielectric regions of the bottom spacers comprise a low-k dielectric and the liner regions disposed adjacent the dielectric regions comprises a nitride liner.

Patterning the two or more fins may comprise depositing a bottom source/drain material over the substrate to form the bottom source/drain layer, depositing a layer of fin material over the bottom/source drain layer, patterning a hard mask over a top surface of the fin material, and removing portions of the fin material exposed by the hard mask to pattern the two or more fins. The substrate may comprise bulk Si, the bottom/source drain layer may comprise at least one of doped Si and doped SiGe, the two or more fins may comprise undoped Si, and the hard mask may comprise at least one of a nitride and an oxide-nitride bilayer.

Forming the bottom spacers may comprise depositing a liner over the two or more fins and exposed portions of a top surface of the bottom source/drain layer, depositing an oxide over the liner, and performing CMP of the oxide stopping on a top surface of the liner formed over the two or more fins. Depositing the liner may comprise depositing liner material using a conformal deposition process, and the liner material may comprise at least one of SiN and SiCN.

In some embodiments, forming the bottom spacers further comprises etching portions of the liner such that a height of a first portion of the liner surrounding a first sidewall of a given one of the two or more fins is different than a height of a second portion of the liner surrounding at least one of: a second sidewall of the given fin; and one or more sidewalls of at least one other one of the two or more fins. Etching portions of the liner may utilize a RIE process. Remaining portions of the liner may form the liner regions of the bottom spacers.

Forming the bottom spacers may further comprise etching a portion of the oxide, over-etching remaining portions of the liner, wherein over-etching the remaining portions of the liner forms: he divots in the bottom source/drain layer; and laterally undercut portions of the liner formed over a top surface of the bottom source/drain layer beneath remaining portions of the oxide, and removing the remaining portions of the oxide.

Forming the bottom spacers may further comprise filling a dielectric material over the two or more fins to fill: (i) the divots in the bottom source/drain layer; and (ii) regions exposed by laterally undercutting the liner, and etching the dielectric material to form the dielectric regions of the bottom spacers.

The method may further comprise forming a dielectric layer on sidewalls of the two or more fins and over top surfaces of the bottom spacers, wherein a height of the dielectric layer is below top surfaces of the two or more fins. In some embodiments, a WFM layer is formed over the dielectric layer. Gates may be formed over the dielectric layer surrounding the two or more fins. Top spacers may be formed over the gates and the dielectric layer, the top spacers having top surfaces with heights matching top surfaces of the two or more fins. The method may further comprise depositing an ILD layer over the top surfaces of the top spacers, removing hard masks disposed over the two or more fins, and forming top source/drain epitaxial layers over the top surfaces of the two or more fins in regions exposed by removal of the hard masks.

In some embodiments, a semiconductor structure comprises a substrate, bottom source/drain regions disposed over the substrate, two or more fins disposed over a top surface of the bottom source/drain regions, and bottom spacers disposed over the top surface of the bottom source/drain layer between the two or more fins, the bottom spacers having a uniform height on sidewalls of the two or more fins. The bottom spacers may comprise dielectric regions disposed adjacent the sidewalls of the two or more fins and at least partially filling divots in the bottom source/drain regions and liner regions disposed adjacent the dielectric regions. The two or more fins comprise channels for a VFET device. The semiconductor structure may further comprise a dielectric layer disposed on sidewalls of the two or more fins and over top surfaces of the bottom spacers, gates disposed over the dielectric layer surrounding the two or more fins, top spacers disposed over the gates and the dielectric layer, the top spacers having top surfaces with heights matching top surfaces of the two or more fins, an ILD layer disposed over the top surfaces of the top spacers, and top source/drain epitaxial layers disposed over the top surfaces of the two or more fins.

In some embodiments, an integrated circuit comprises a VFET device comprising a substrate, bottom source/drain regions disposed over the substrate, two or more fins disposed over a top surface of the bottom source/drain regions, the two or more fins comprising channels for the VFET device, and bottom spacers disposed over the top surface of the bottom source/drain layer between the two or more fins, the bottom spacers having a uniform height on sidewalls of the two or more fins. The bottom spacers comprise dielectric regions disposed adjacent the sidewalls of the two or more fins and at least partially filling divots in the bottom source/drain regions and liner regions disposed adjacent the dielectric regions. The VFET device may further comprise a dielectric layer disposed on sidewalls of the two or more fins and over top surfaces of the bottom spacers, gates disposed over the dielectric layer surrounding the two or more fins, top spacers disposed over the gates and the dielectric layer, the top spacers having top surfaces with heights matching top surfaces of the two or more fins, an ILD layer disposed over the top surfaces of the top spacers, and top source/drain epitaxial layers disposed over the top surfaces of the two or more fins.

It is to be appreciated that the various materials, processing methods (e.g., etch types, deposition types, etc.) and dimensions provided in the discussion above are presented by way of example only. Various other suitable materials processing methods and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    patterning two or more fins over a top surface of a bottom source/drain layer, the bottom source/drain layer disposed over a substrate; and
    forming bottom spacers disposed over the top surface of the bottom source/drain layer between the two or more fins, the bottom spacers having a uniform height on sidewalls of the two or more fins;
    wherein the bottom spacers comprise:
        dielectric regions disposed adjacent the sidewalls of the two or more fins and at least partially filling divots in the bottom source/drain regions; and liner regions disposed adjacent the dielectric regions; and wherein the two or more fins comprise channels for a vertical field-effect transistor (VFET) device.

2. The method of claim 1, wherein the dielectric regions of the bottom spacers comprise a low-k dielectric and the liner regions disposed adjacent the dielectric regions comprises a nitride liner.

3. The method of claim 1, wherein patterning the two or more fins comprises:
   depositing a bottom source/drain material over the substrate to form the bottom source/drain layer;
   depositing a layer of fin material over the bottom/source drain layer;
   patterning a hard mask over a top surface of the fin material; and
   removing portions of the fin material exposed by the hard mask to pattern the two or more fins.

4. The method of claim 3, wherein:
   the substrate comprises bulk silicon;
   the bottom/source drain layer comprises at least one of doped silicon and doped silicon germanium;
   the two or more fins comprise undoped silicon; and
   the hard mask comprises at least one of a nitride and an oxide-nitride bilayer.

5. The method of claim 1, wherein forming the bottom spacers comprises:
   depositing a liner over the two or more fins and exposed portions of a top surface of the bottom source/drain layer;
   depositing an oxide over the liner; and
   performing chemical mechanical planarization of the oxide stopping on a top surface of the liner formed over the two or more fins.

6. The method of claim 5, wherein depositing the liner comprises depositing liner material using a conformal deposition process and wherein the liner material comprises at least one of silicon nitride and silicon carbonitride.

7. The method of claim 5, wherein forming the bottom spacers further comprises etching portions of the liner such that a height of a first portion of the liner surrounding a first sidewall of a given one of the two or more fins is different than a height of a second portion of the liner surrounding at least one of: a second sidewall of the given fin; and one or more sidewalls of at least one other one of the two or more fins.

8. The method of claim 7, wherein etching portions of the liner comprises utilizing a reactive-ion etching process.

9. The method of claim 7, wherein remaining portions of the liner form the liner regions of the bottom spacers.

10. The method of claim 7, wherein forming the bottom spacers further comprises:
    etching a portion of the oxide;
    over-etching remaining portions of the liner, wherein over-etching the remaining portions of the liner forms:
       the divots in the bottom source/drain layer; and laterally undercut portions of the liner formed over a top surface of the bottom source/drain layer beneath remaining portions of the oxide; and
    removing the remaining portions of the oxide.

11. The method of claim 10, wherein forming the bottom spacers further comprises:
    filling a dielectric material over the two or more fins to fill: (i) the divots in the bottom source/drain layer; and (ii) regions exposed by laterally undercutting the liner; and
    etching the dielectric material to form the dielectric regions of the bottom spacers.

12. The method of claim 1, further comprising forming a dielectric layer on sidewalls of the two or more fins and over top surfaces of the bottom spacers, wherein a height of the dielectric layer is below top surfaces of the two or more fins.

13. The method of claim 12, further comprising forming a work function metal layer over the dielectric layer.

14. The method of claim 12, further comprising forming gates over the dielectric layer surrounding the two or more fins.

15. The method of claim 14, further comprising forming top spacers over the gates and the dielectric layer, the top spacers having top surfaces with heights matching top surfaces of the two or more fins.

16. The method of claim 15, further comprising:
    depositing an interlayer dielectric layer over the top surfaces of the top spacers;
    removing hard masks disposed over the two or more fins; and
    forming top source/drain epitaxial layers over the top surfaces of the two or more fins in regions exposed by removal of the hard masks.

17. A semiconductor structure, comprising:
    a substrate;
    bottom source/drain regions disposed over the substrate;
    two or more fins disposed over a top surface of the bottom source/drain regions; and
    bottom spacers disposed over the top surface of the bottom source/drain layer between the two or more fins, the bottom spacers having a uniform height on sidewalls of the two or more fins;
    wherein the bottom spacers comprise:
       dielectric regions disposed adjacent the sidewalls of the two or more fins and at least partially filling divots in the bottom source/drain regions; and
       liner regions disposed adjacent the dielectric regions; and
    wherein the two or more fins comprise channels for a vertical field-effect transistor (VFET) device.

18. The semiconductor structure of claim 17, further comprising:
    a dielectric layer disposed on sidewalls of the two or more fins and over top surfaces of the bottom spacers;
    gates disposed over the dielectric layer surrounding the two or more fins;
    top spacers disposed over the gates and the dielectric layer, the top spacers having top surfaces with heights matching top surfaces of the two or more fins;
    an interlayer dielectric layer disposed over the top surfaces of the top spacers; and
    top source/drain epitaxial layers disposed over the top surfaces of the two or more fins.

19. An integrated circuit comprising:
    a vertical field-effect transistor (VFET) device comprising:
       a substrate;
       bottom source/drain regions disposed over the substrate;
       two or more fins disposed over a top surface of the bottom source/drain regions, the two or more fins comprising channels for the VFET device; and
       bottom spacers disposed over the top surface of the bottom source/drain layer between the two or more fins, the bottom spacers having a uniform height on sidewalls of the two or more fins;
    wherein the bottom spacers comprise:

dielectric regions disposed adjacent the sidewalls of the two or more fins and at least partially filling divots in the bottom source/drain regions; and
liner regions disposed adjacent the dielectric regions.

20. The integrated circuit of claim 19, wherein the VFET device further comprises:
a dielectric layer disposed on sidewalls of the two or more fins and over top surfaces of the bottom spacers;
gates disposed over the dielectric layer surrounding the two or more fins;
top spacers disposed over the gates and the dielectric layer, the top spacers having top surfaces with heights matching top surfaces of the two or more fins;
an interlayer dielectric layer disposed over the top surfaces of the top spacers; and
top source/drain epitaxial layers disposed over the top surfaces of the two or more fins.

* * * * *